United States Patent
Van Tuijl et al.

[11] Patent Number: 6,107,894
[45] Date of Patent: Aug. 22, 2000

[54] COUPLED SAWTOOTH OSCILLATOR

[75] Inventors: Adrianus J.M. Van Tuijl, Nijmegen; Sander L.J. Gierkink, Enschede, both of Netherlands

[73] Assignee: U.S. Philips Corporation, New York, N.Y.

[21] Appl. No.: 09/288,396

[22] Filed: Apr. 8, 1999

[30] Foreign Application Priority Data

Apr. 9, 1998 [EP] European Pat. Off. .............. 98201085

[51] Int. Cl.$^7$ ........................................ H03B 5/24
[52] U.S. Cl. ........................ 331/143; 331/57; 331/111; 331/175
[58] Field of Search ................. 331/34, 57, 111, 331/143, 175, 177 R

[56] References Cited

U.S. PATENT DOCUMENTS 5,952,891 9/1999 Boudry ...................................... 331/57

OTHER PUBLICATIONS

"A 1.2—μm CMOS Current–Controller Oscillator", by Michael P. Flynn et al, IEEE Journal of Solid=State Circuit, vol. 27, No. 7, Jul. 1992, pp. 982–987.

*Primary Examiner*—David Mis

[57] ABSTRACT

Relaxation oscillator comprising a chain of coupled sawtooth generator stages. Each stage has a capacitor which is charged and discharged. The charging of a capacitor begins when the voltage ($C_{C1}$) of a previous stage reaches a threshold voltage ($V_H$). To avoid sampling of noise on the threshold voltage ($V_H$) each new voltage ramp is started gradually.

12 Claims, 15 Drawing Sheets

COUPLED SAWTOOTH OSCILLATOR

BACKGROUND OF THE INVENTION

The invention relates to a relaxation oscillator including stages each having a capacitor and means for charging the capacitor as soon as the voltage of the capacitor of another stage passes a first threshold voltage.

Such a relaxation oscillator is known inter alia from an article published in IEEE Journal of Solid State Circuits, Vol. 27, No. 7, July, 1992, pp. 982–987, particularly from FIG. 4 of this article. This article describes a two-stage relaxation oscillator in which the charging of the one stage is started when the voltage of the other stage passes a threshold voltage. Once the one capacitor is charged the other capacitor is discharged. Charging is effected with a constant current whose magnitude is adjustable. Discharging is effected by means of a discharge switch in such a short time that the period of one cycle and, consequently, the frequency of the relaxation oscillator is determined solely by the sum of the charging times of the two capacitors. By making the charging currents adjustable by means of a control signal, for example a control current or a control voltage, the frequency of the oscillator can be varied. This makes such an oscillator suitable for use as a voltage-controlled oscillator (VCO) or current-controlled oscillator (CCO) in phase-locked loops (PLL) and as a frequency modulator or demodulator. These applications require a high linearity and a low phase jitter. The linearity defines the relationship between the oscillation frequency and the magnitude of the control signal. Detection whether the threshold voltage is reached is effected by means of a decision circuit, usually a comparator or a Schmitt trigger, which compares the instantaneous voltage on the capacitor to be charged with a threshold voltage. Such a decision circuit has an internal inertia, as a result of which a certain delay $T_d$ occurs until the threshold voltage detection takes effect. The effect of this delay increases comparatively as the oscillation frequency increases. The result is that the oscillation frequency no longer increases proportionally as the control signal increases. For high frequencies the linearity deteriorates. Reducing the delay $T_d$, i.e. choosing a faster decision circuit, improves the high-frequency linearity but at the same time it causes the noise bandwidth of the equivalent input noise of the decision circuit to increase. The equivalent input noise of the decision circuit may be assumed to be superimposed on the threshold voltage. As a consequence, the threshold voltage fluctuates and charging of the capacitors each time starts at another instant. As the decision circuit is faster the bandwidth of its equivalent input noise becomes larger and the input noise is also sampled with a larger bandwidth by the decision circuit. This results in an increasing phase noise or jitter as the delay of the decision circuit decreases. Therefore, it is difficult to construct a relaxation oscillator having a high linearity as well as a low phase noise.

SUMMARY OF THE INVENTION

It is an object of the invention to provide relaxation oscillators having improved characteristics as regards the linearity and/or the phase noise. To this end, the relaxation oscillator of the type defined in the opening paragraph is characterized in that the means for charging are adapted to gradually cause the charging of the capacitor to be started.

Gradually causing the charging of the capacitor to be started reduces the influence of the equivalent input noise because the decision instant is spread in time. As a result of this, the noise on the reference level is sampled with a substantially smaller bandwidth, which considerably reduces the amplitude of the phase noise or jitter. Gradually increasing the charging current can be achieved in various manners, for example by means of a voltage-controlled or current-controlled current source which is gradually turned on by a comparator. Very suitable for this purpose is a differential transistor pair whose tail current is fed to the capacitor to be charged via one of the transistors of the transistor pair. The one transistor of the transistor pair has its control electrode connected to the threshold voltage and the other transistor has its control electrode connected to the capacitor whose voltage is monitored. The advantage of the use of a transistor pair as a decision element is not only the simplicity but also the linearity. To enable the oscillation frequency to be varied the tail current is made variable. Owing to the symmetry properties of the differential transistor pair the current range in which the deciding differential pair raises the charging current for the capacitor from zero to its maximum value is always situated symmetrically with respect to the instant at which the voltage of the capacitor being monitored passes the threshold voltage, regardless of the magnitude of the tail current.

Configurations having two or more stages are possible for the relaxation oscillator in accordance with the invention. In configurations having only a few stages comparatively little time may be available to discharge a capacitor before this capacitor can be recharged. In such cases special provisions are necessary in order to achieve a correct timing of the charging and discharging operations of the capacitors in the various stages. Measures by means of which this is possible are defined in the subsidiary claims.

When the relaxation oscillator is started the charge conditions of the various capacitors in the mutually coupled stages are indeterminate. In order to ensure a correct starting of the various conditions the invention proposes measures which are defined in the subsidiary claims.

The structure and the timing of the relaxation oscillator according to the invention allows the off-switching of currents in a stage during time periods in which the capacitor of that stage is not being charged. This directly results in a reduction of current consumption of the relaxation oscillator, which is particularly interesting for configurations having two or more stages. This off-switching of currents may also contribute to a reduced effect of the 1/f noise component in the charging current, particularly in CMOS implementations of the stages. Implementations of this off-switching are defined in the subsidiary claims.

BRIEF DESCRIPTION OF THE DRAWINGS

These and other aspects of the invention will be described in more detail with reference to the accompanying drawings, in which.

DESCRIPTION OF THE PREFERRED EMBODIMENTS

Figure 1:
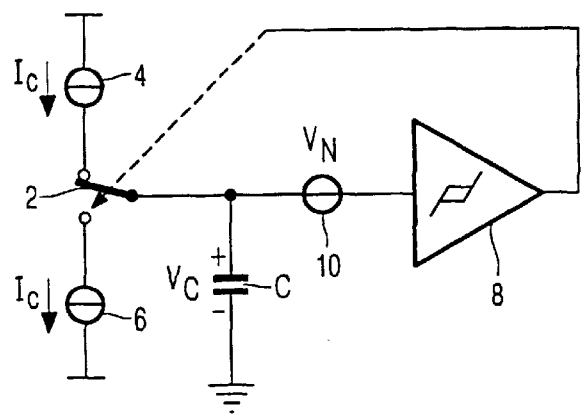
FIG. 1 is a functional diagram of a first prior-art relaxation oscillator.
Figure 2:
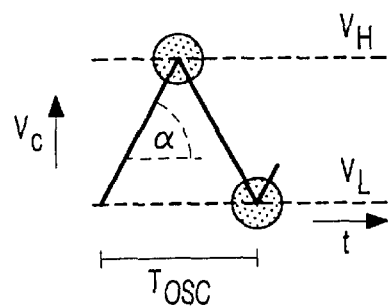
FIG. 2 is a diagram which represents the voltage waveform across the capacitor of the relaxation oscillator of FIG. 1.
Figure 3:
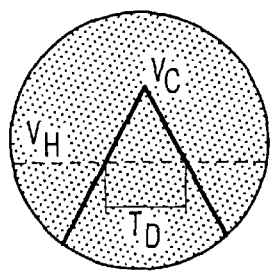
FIG. 3 shows a detail of the voltage waveform shown in FIG. 2.
Figure 4:
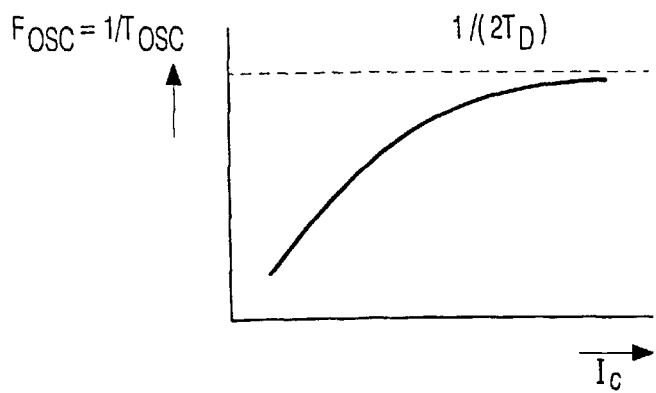
FIG. 4 is a graph which illustrates the relationship between the oscillation frequency and the control current of the relaxation oscillator of FIG. 1.

FIG. 1 is a functional diagram of a prior-art relaxation oscillator. A capacitor C is alternately connected to a charging current source 4 and a discharging current source 6 by means of a switch 2. Both current sources 4 and 6 supply an equal current $I_C$ which is controllable in practice. The voltage $V_C$ across the capacitor C is monitored by a Schmitt trigger 8 with internal threshold voltages $V_H$ and $V_L$. Thus, as is shown in FIG. 2, the direction of the charging current of the capacitor C is reversed when the voltage $V_C$ passes one of the threshold voltages $V_H$ and $V_L$. The tangent of the angle of inclination $\alpha$ is determined by the quotient of the charging current $I_C$ and the capacitance of the capacitor C. In the case of an ideal Schmitt trigger the oscillation period $T_{OSC}$ only depends on the angle of inclination $\alpha$ and on the voltage difference $(V_H-V_L)$ between the threshold voltages $V_H$ and $V_L$, so that there is a linear relationship between the charging current $I_C$ and the oscillation period $T_{OSC}$ and, as a consequence, between the charging current $I_C$ and the oscillation frequency $F_{OSC}$. However, in practice, owing to the finite bandwidth the Schmitt trigger 8 introduces a certain delay $T_D$ in the decision whether the capacitor voltage $V_C$ passes the threshold value $V_H$ or $V_L$. As a result, the capacitor voltage $V_C$ overshoots the value $V_H$. In FIG. 3 this effect is illustrated in more detail. The result is that a fixed amount is added to the ideal oscillation period, which amount is independent of the charging current $I_C$. This leads to a non-linear relationship between the charging current $I_C$ and the oscillation frequency $F_{OSC}$, which relationship is shown in FIG. 4.

Figure 5:
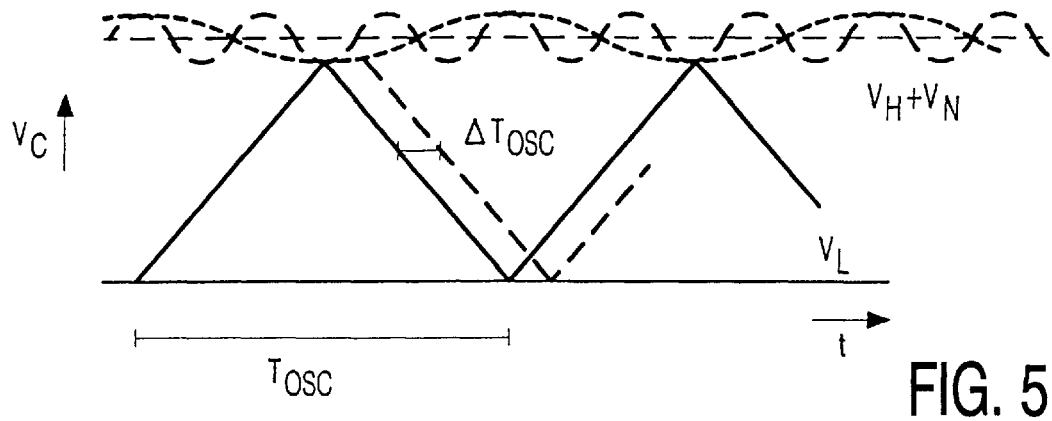
FIG. 5 is a diagram which represents the voltage waveform across the capacitor of the relaxation oscillator of FIG. 1, illustrating the effect of noise on a decision level.

The linearity can be improved by speeding up the Schmitt trigger 8. However, this also leads to an increase in bandwidth of the noise voltage $V_N$ of the equivalent input noise voltage source 10 of the Schmitt trigger 8. This, in turn, results in an increase of the phase jitter of the oscillator, which is caused by the sampling action of the Schmitt trigger 8. The equivalent input noise voltage $V_N$ may be added to the threshold voltages $V_H$ and $V_L$. FIG. 5 shows the variation of the capacitor voltage $V_C$, where for the sake of simplicity only noise has been added to the threshold voltage $V_H$. At the decision levels $V_H$ and $V_L$ the noise is sampled by the Schmitt trigger, which leads to a variation $\Delta T_{OSC}$ in the nominal oscillation period. Owing to the random nature of the noise the variation $\Delta T_{OSC}$ is different each time and gives rise to phase jitter. Only two sinusoidal components of the noise are shown, which both give rise to the same variation $\Delta T_{OSC}$. Thus, it appears that different noise components having a given mutual frequency relationship can lead to the same variation in the oscillation period $T_{OSC}$. Therefore, an increasing bandwidth results in an increasing number of frequency components which give rise to a given value of the $\Delta T_{OSC}$. In other words, the phase jitter increases as the bandwidth increases. The improvement in linearity as a result of the increased bandwidth of the Schmitt trigger is attended by an undesirable increase of the phase jitter of the oscillator.

Figure 6:
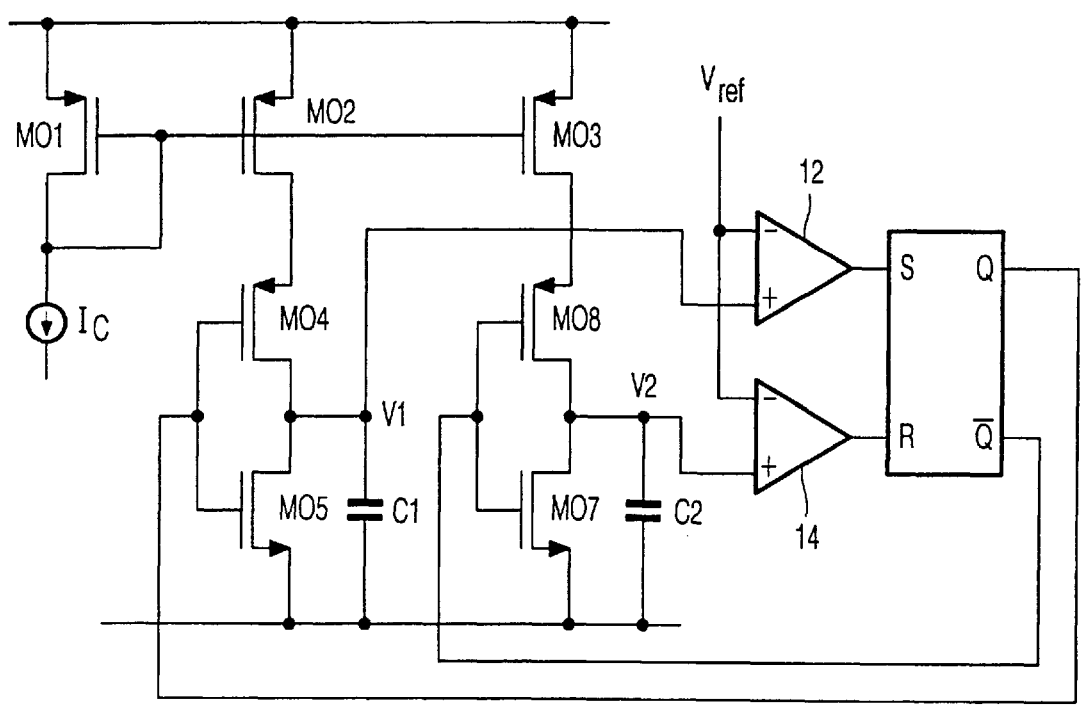
FIG. 6 is a diagram of a second prior-art relaxation oscillator.
Figure 7:
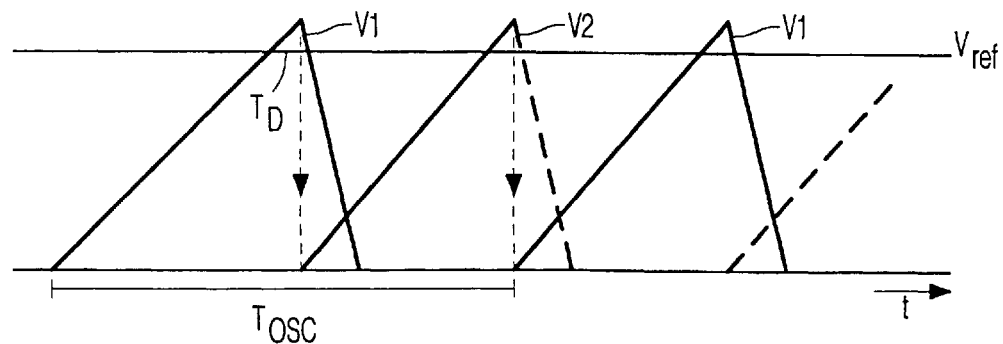
FIG. 7 is a diagram which represents the voltage waveform across the capacitors of the relaxation oscillator of FIG. 6.

FIG. 6 shows a known two-stage relaxation oscillator, charging of the capacitor C2 of the one stage being started when the voltage V1 across the capacitor C1 of the other stage passes a threshold voltage $V_{ref}$. Once the one capacitor is charged the other capacitor is discharged. Charging is effected with a constant current whose magnitude is adjustable. Discharging is effected by means of a discharge switch MO5/MO7 in such short time that the period $T_{OSC}$ of a cycle and, consequently, the frequency of the relaxation oscillator is determined only by the sum of the charging times of the two capacitors. FIG. 7 shows the sawtooth-shaped waveforms of the voltages V1 and V2 across the two capacitors C1 and C2. For a more comprehensive description of the operation of this known relaxation oscillator reference is made to the afore-mentioned article in IEEE Journal of Solid State Circuits, Vol. 27, No. 7, July, 1992, pp. 982–987. In this type of relaxation oscillator the delay time and the noise bandwidth of the comparators 12 and 14 have a similar influence on the linearity and the phase jitter.

Figure 8:
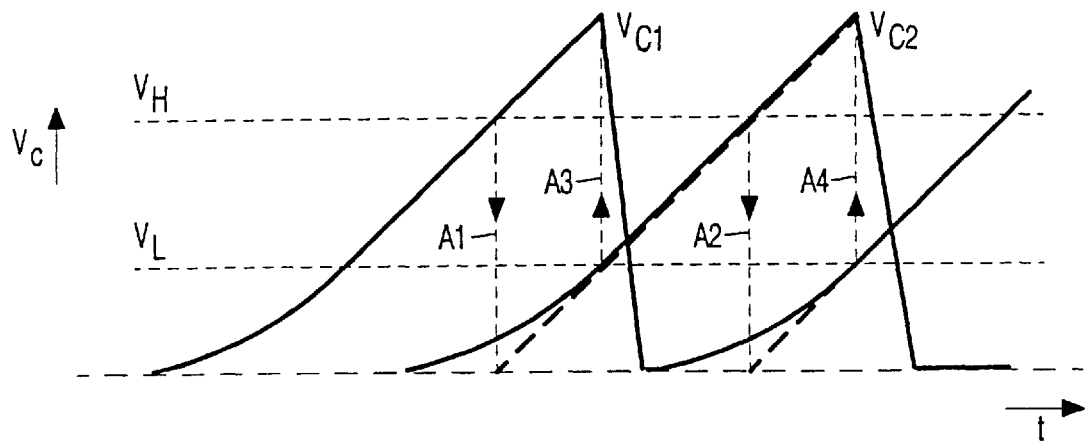
FIG. 8 is a diagram which represents the waveforms of the capacitor voltages in a relaxation oscillator in accordance with the invention.

As shown in FIG. 8, in order to reduce the phase jitter in accordance with the invention, each new rising edge of the sawtooth voltage across a capacitor is started gradually when the rising edge of the sawtooth voltage across another capacitor passes the threshold voltage $V_H$. These instants are marked by means of arrows A1 and A2. A capacitor is discharged when the rising edge of the sawtooth voltage of another capacitor passes the other threshold voltage $V_L$. This is indicated by the arrows A3 and A4. The gradual starting results in an effective filtering of the noise at the level $V_H$. This is because the decision to start the charging of the capacitor with a given charging current is now spread in time. Each sawtooth voltage is generated in a stage by a capacitor which is charged and discharged. Since the sawtooth voltages control one another, this configuration of stages is called a coupled sawtooth oscillator.

Figure 9:
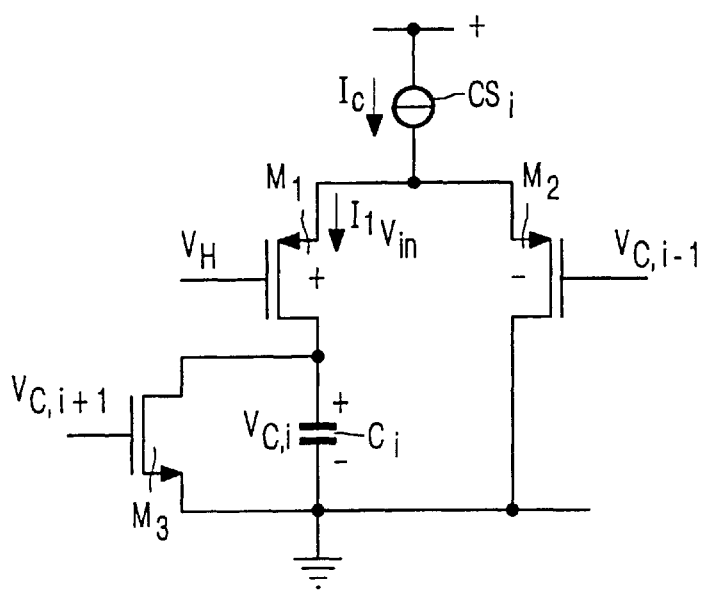
FIG. 9 is a diagram showing the construction of a stage in a relaxation oscillator in accordance with the invention.

FIG. 9 shows a possible implementation of a stage bearing the sequence number i in the coupled sawtooth oscillator. The stage comprise a differential pair of PMOS transistors M1 and M2 having their first main elecrodes or sources interconnected and coupled to a charging current source $CS_i$ which supplies a charging current $I_C$. The current from the second main electrode or drain of the transistor $M_1$ flows into a capacitor $C_i$. The current from the drain of the transistor $M_2$ is drained to ground. An NMOS discharging transistor $M_3$ is connected in parallel with the capacitor $C_i$ and has its control electrode or gate connected so as to receive the capacitor voltage $V_{C, i+1}$ from a subsequent stage. The transistor $M_1$ has its gate connected to the threshold voltage $V_H$, which is supplied by a bias voltage source, and the transistor $M_2$ has its gate connected so as to receive the capacitor voltage $V_{C, i+1}$ from a preceding stage.

Figure 10:
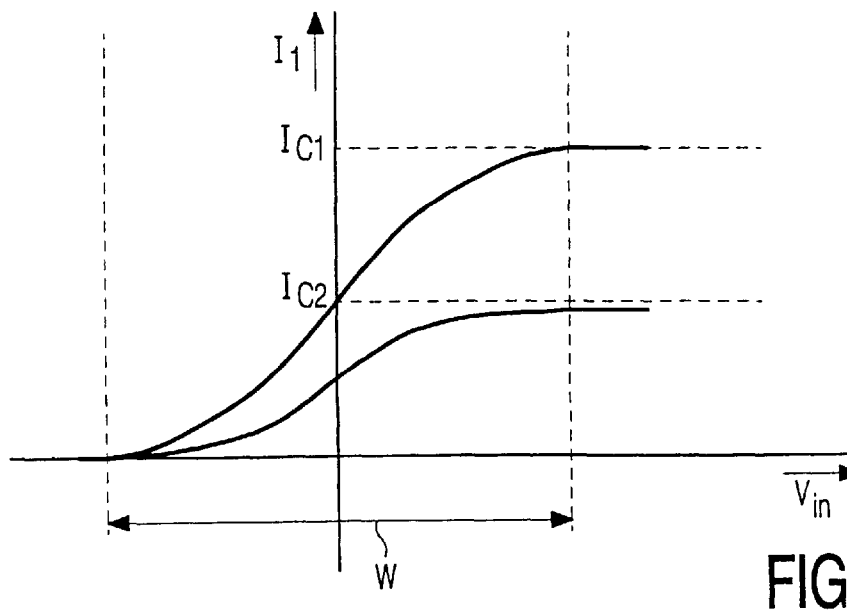
FIG. 10 is a diagram which represents the transfer characteristic of a differential transistor pair for different values of the tail current.

FIG. 10 shows the relationship between the input voltage $V_{in}$ of the differential pair and the drain current $I_1$ of the transistor $M_1$ for two different values $I_{C1}$ and $I_{C2}$ of the charging current $I_C$. The characteristic curve ensures a gradual increase of the current $I_1$ to the capacitor $C_i$, as a result of which the voltage $V_{C,i}$ becomes as shown in FIG. 8. The transistor $M_3$ assures that the capacitor $C_i$ is discharged at the instant at which the voltage $V_{C, i+1}$ in the adjacent stage passes threshold voltage $V_L$. In this case the threshold voltage $V_L$ is equal to the source threshold voltage $V_T$ of the NMOS transistor $M_3$. The simplicity of the differential pair has the additional advantage that only little noise $V_N$ is added to the decision threshold $V_H$.

Figure 11:
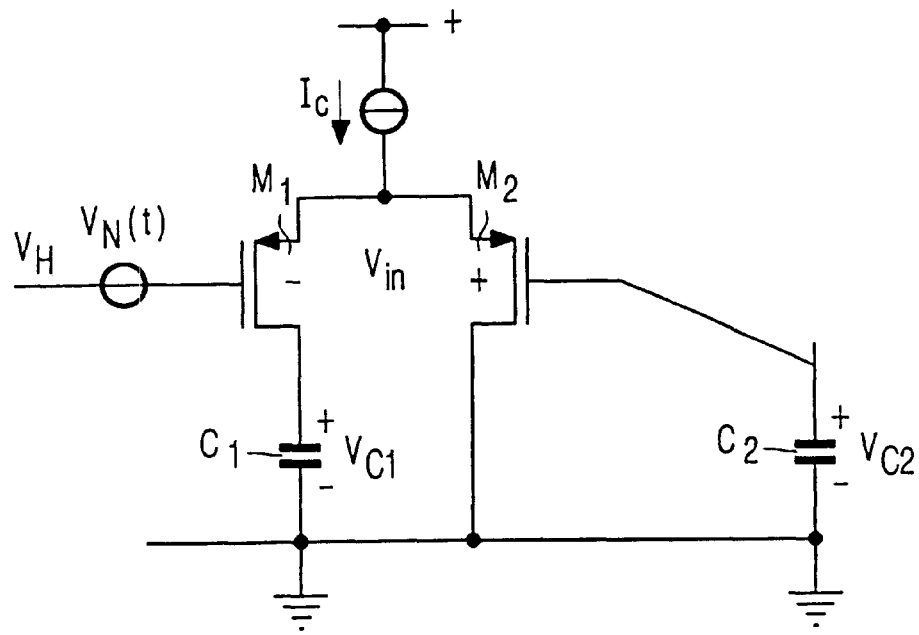
FIG. 11 shows a diagram of a circuit in which a stage as shown in FIG. 9 is driven by the capacitor voltage of a stage elsewhere in the relaxation oscillator in accordance with the invention.

FIG. 11 shows how a capacitor $C_2$ elsewhere in the coupled sawtooth oscillator controls a stage. When the voltage $V_{C2}$ across the capacitor $C_2$ comes within the control window W (see FIG. 10) of the differential pair $M_1$–$M_2$, which control window is centered about the voltage $V_H$ on the gate of the transistor $M_1$, charging of the capacitor $C_1$ is started. The voltage $V_N(t)$ in series with the gate of the transistor $M_1$ represents the equivalent input noise of the transistors $M_1$ and $M_2$ as well as the noise present on the threshold voltage $V_H$.

Figure 12:
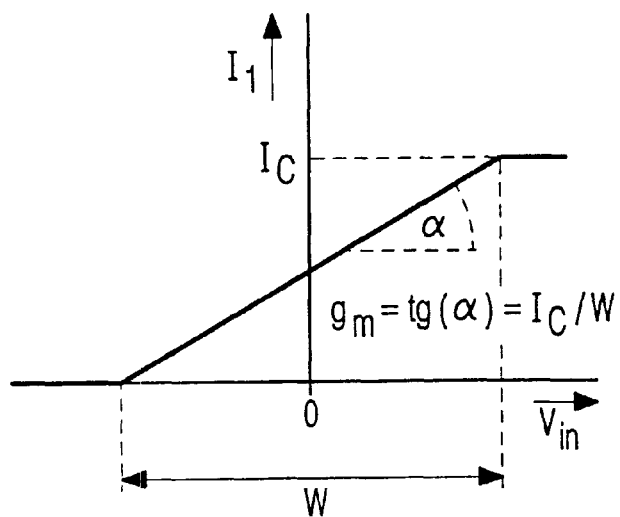
FIG. 12 is a diagram which represents the linearized transfer characteristic of a differential transistor pair.

The use of a differential pair not only reduces the phase jitter but it also guarantees the linearity of the oscillator. This is because the transfer characteristic of the differential pair is point-symmetrical in the control window W. See also FIG. 12, which shows the linearized transfer characteristic of the differential pair. The drain current $I_1$ increases from the maximum value $I_C$ when the input voltage $V_{in}$ increases within the control window W. The transfer characteristic then exhibits a transconductance $g_m$=tan $(\alpha)$=$I_C$/W. Owing to the point-symmetry the curved portion in the sawtooth voltage which appears across the capacitor during the gradual start-up does not give rise to an error in the timing of the subsequent linear portion of this rising edge of the sawtooth voltage. See FIG. 8: the linear portions of the rising edge shown as a dotted line and the actual edge coincide.

Figure 13:
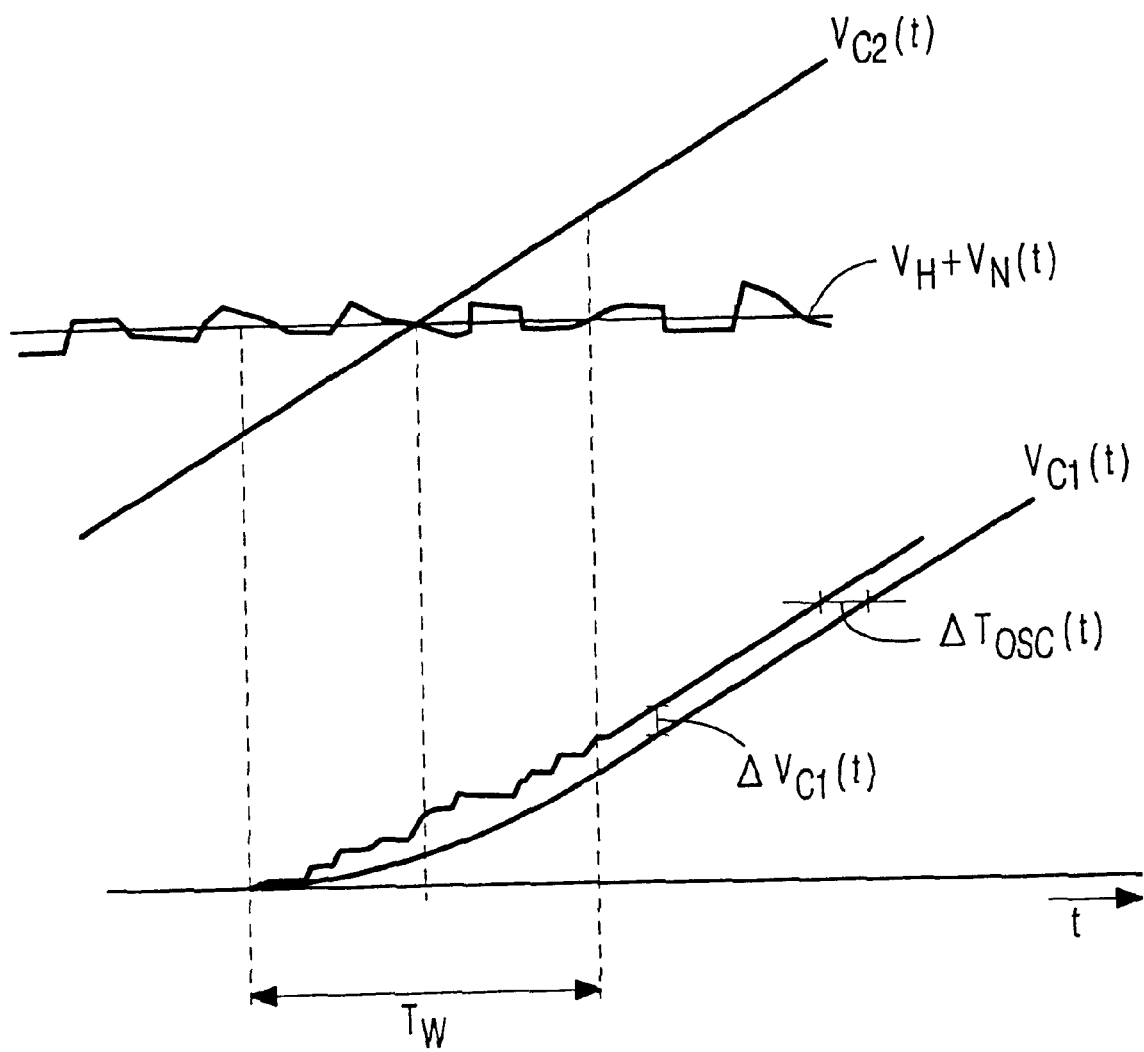
FIG. 13 is a diagram which represents the variation of the capacitor voltage as a function of time around the instant of turning on of the charging current of a capacitor in a stage of the relaxation oscillator in accordance with the invention.

FIG. 13 represents the variation of the capacitor voltages as a function of time around the starting instant of the capacitor $C_1$ in FIG. 11. The curved portion of the capacitor voltage $V_{C1}(t)$ appears during a switching time $T_W$ whose value is equal to the quotient of the capacitance value of the capacitor $C_1$ and the afore-mentioned transconductance $g_m$. As the noise voltage $V_N(t)$ is integrated in the capacitor $C_1$ during the switching time $T_W$, it is achieved that the noise voltage is effectively filtered, as a result of which in particular high-frequency components in the noise voltage $V_N(t)$ will contribute to a smaller extent to the deviation $\Delta T_{OSC}$ in the period $T_{OSC}$.

Figure 14:
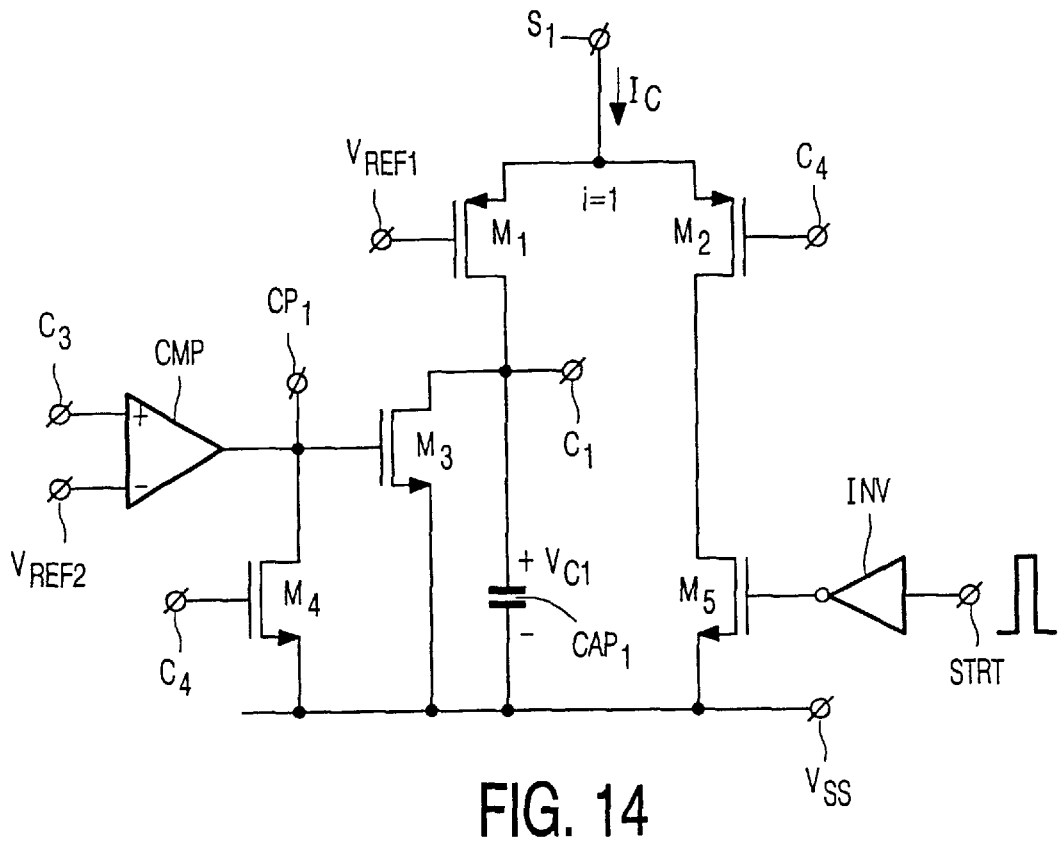
FIG. 14 is an electrical circuit diagram of the first stage of a four-stage relaxation oscillator in accordance with the invention.
Figure 15:
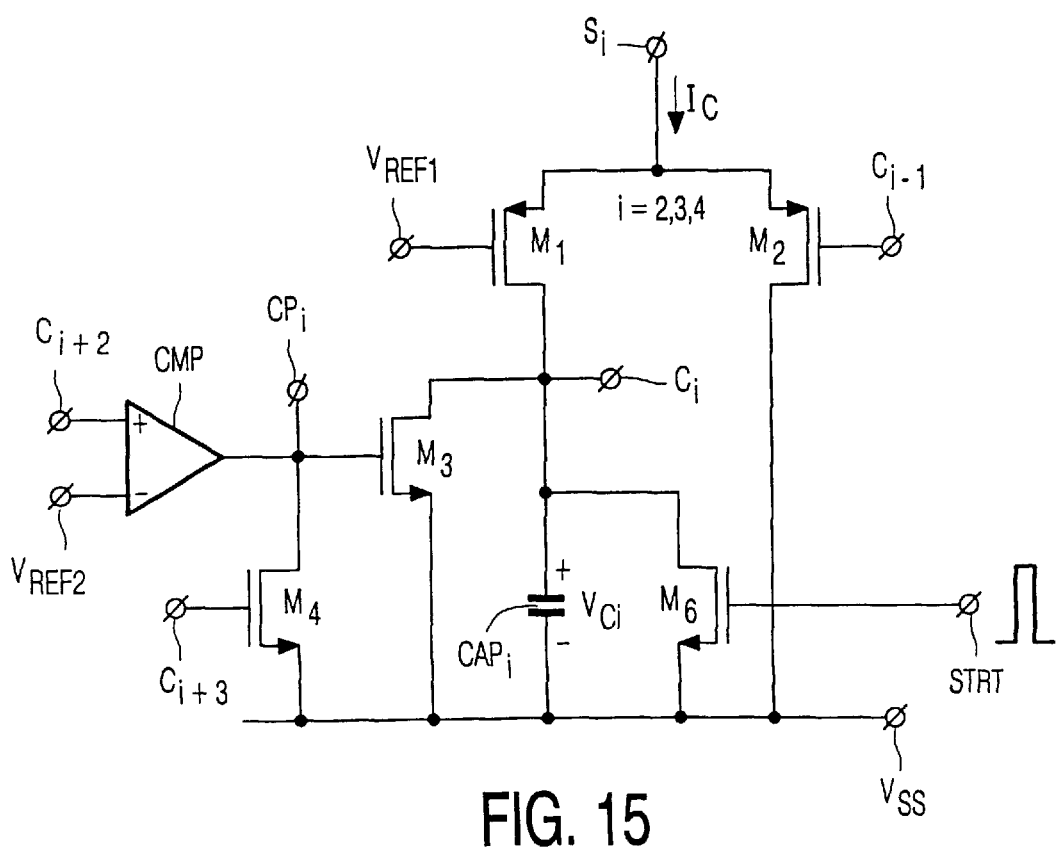
FIG. 15 is an electrical circuit diagram of the second, the third and the fourth stage of a four-stage relaxation oscillator in accordance with the invention.
Figure 16:
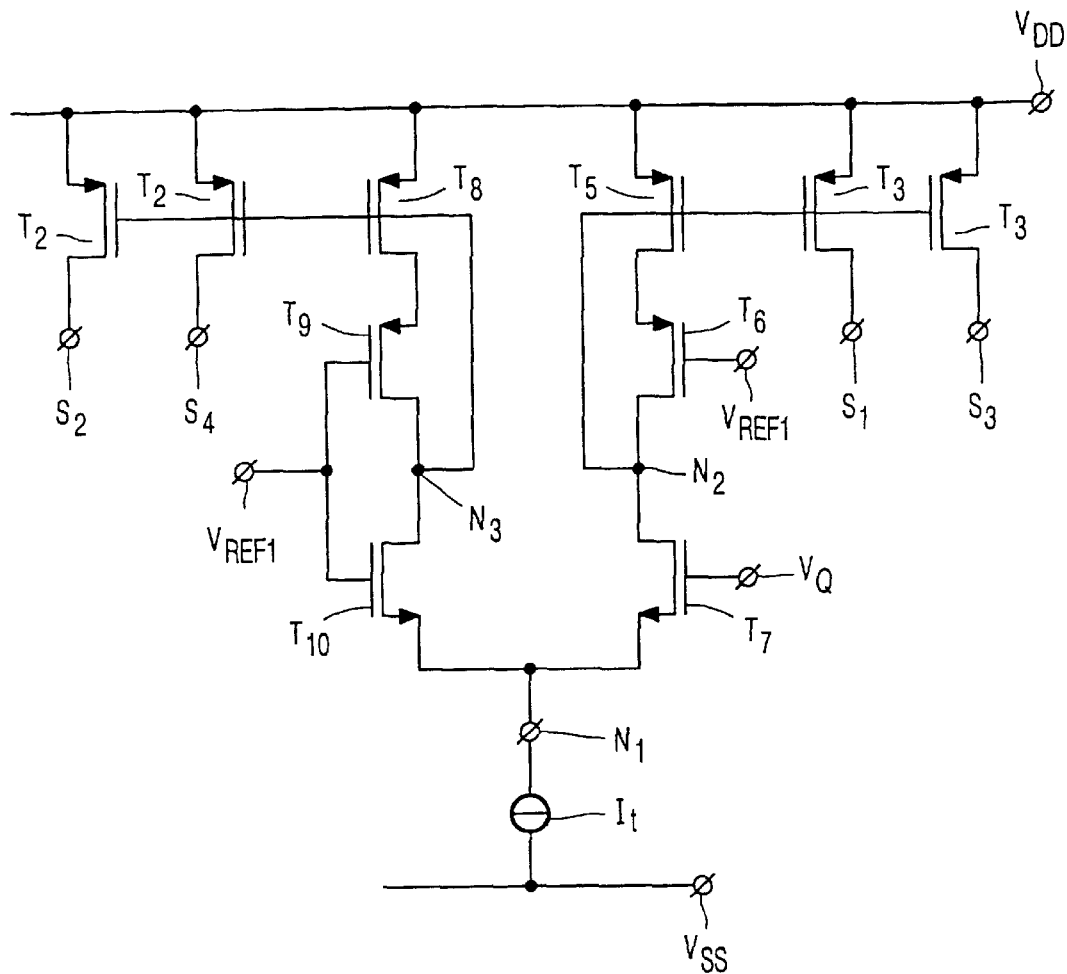
FIG. 16 is an electrical circuit diagram of the charging current supply of a four-stage relaxation oscillator in accordance with the invention.

FIG. 14 shows the electrical circuit diagram of the first stage of a four-stage coupled sawtooth oscillator, of which FIG. 15 shows the circuit diagram of the second, the third and the fourth stage and of which FIG. 16 shows the charging current supply for the four stages. The first stage in FIG. 14 comprises a differential pair of MOS transistors $M_1$ and $M_2$ having their sources connected to a terminal $S_1$ from which a charging current $I_C$ issues. The transistor $M_1$ of the differential pair has its gate connected to a terminal $V_{REF1}$ which receives a first threshold voltage from a reference voltage source (not shown). The other transistor $M_2$ of the differential pair has its gate connected to the terminal $C_4$ of the fourth stage. The stage has a capacitor $CAP_1$ connected between the drain of the transistor $M_1$ and a negative supply terminal $V_{SS}$. The voltage across the capacitor $CAP_1$ is available on a terminal $C_1$. The transistor $M_2$ has its drain connected to the negative supply terminal $V_{SS}$ via the main current path of an NMOS starting transistor $M_5$. The gate of the starting transistor $M_5$ receives an inverted starting signal on a terminal STRT, which signal has been inverted by means an inverter INV. The starting signal is briefly high when the oscillator circuit is started. An NMOS transistor $M_3$ arranged in parallel with the capacitor $CAP_1$ allows the capacitor CAP1 to be discharged. The gate of the transistor $M_3$ is driven by a comparator CMP, whose output signal is available on a terminal $CP_1$. The drive to the gate of the transistor $M_3$ can be inhibited by means of an NMOS transistor $M_4$, whose main current path is connected between the gate of the transistor $M_3$ and the negative supply terminal $V_{SS}$ and whose gate is connected to the terminal $C_4$ of the fourth stage. The comparator CMP has inputs, of which a positive input is connected to the terminal C3 of the third stage and of which a negative input is connected to a terminal $V_{REF2}$, which supplies a second threshold voltage obtained from a reference voltage source (not shown). The second threshold voltage $V_{REF2}$ is smaller than the first threshold voltage $V_{REF1}$.

FIG. 15 shows the structure of the second, the third and the fourth stage, where i=2, 3 or 4. The structure of these stages is substantially similar to that of the first stage. However, in the present structure the transistor $M_2$ has its drain connected directly to the negative supply terminal $V_{SS}$ and an NMOS starting transistor $M_6$ arranged in parallel with the capacitor $CAP_i$ has its gate connected to the terminal STRT to receive the starting signal. The sources of the differential pair $M_1$–$M_2$ are connected to a terminal $S_i$ from which a charging current $I_C$ issues. The transistor $M_2$ has its gate connected to the terminal $C_{i-1}$, i.e. to the terminal $C_i$ of the stage whose sequence number is 1 lower. The positive input of the comparator CMP is connected to the terminal $C_{i+2}$, i.e. to the terminal $C_i$ of the stage whose sequence number is 2 higher. However, if this results in a sequence number greater than four, it must be decremented by four. The transistor $M_4$ has its gate connected to the terminal $C_{i+3}$, i.e. to the terminal $C_i$ of a stage whose sequence number is 3 higher. In this way, the stages form a ring of coupled sawtooth generators.

FIG. 16 shows the charging current supply for the four stages. The terminals $S_1$ and $S_3$ are coupled to a positive supply terminal $V_{DD}$ via PMOS current source transistors $T_1$ and $T_3$. The current source transistors $T_1$ and $T_3$ together with a PMOS transistor $T_5$ form a current mirror. A PMOS transistor $T_6$ arranged in series with the transistor $T_5$ has its gate connected to the terminal $V_{REF1}$. An NMOS transistor $T_7$ arranged in series with the transistor $T_6$ has its source connected to a node $N_1$ and has its gate connected to a terminal $V_Q$. The transistors $T_1$, $T_3$ and $T_5$ all have their gates connected to the node $N_2$ of the transistors $T_6$ and $T_7$. The terminals $S_2$ and $S_4$ are coupled to the positive supply terminal $V_{DD}$ via PMOS current source transistors $T_2$ and $T_4$. The current source transistors $T_2$ and $T_4$ together with a PMOS transistor $T_8$ form a current mirror. A PMOS transistor Tg arranged in series with the transistor $T_8$ has its gate connected to the terminal $V_{REF1}$. An NMOS transistor $T_{10}$ arranged in series with the transistor $T_9$ has its source connected to the node $N_1$ and has its gate also connected to the terminal $V_{REF1}$. The transistors $T_2$, $T_4$ and $T_8$ all have their gates connected to the node $N_3$ of the transistors $T_9$ and $T_{10}$. The node $N_1$ is coupled to the negative supply terminal $V_{SS}$ via a bias current source $I_r$. The oscillation frequency of the coupled sawtooth generator is controlled by means of the bias current source $I_r$.

Figure 17:
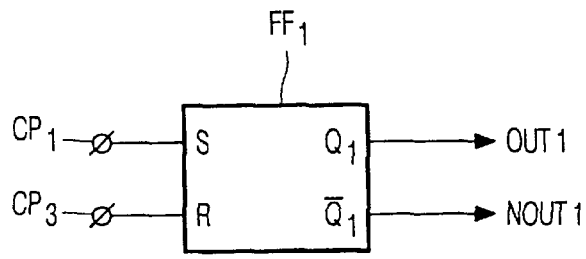
FIG. 17 is a circuit diagram of output flip-flops for use in a four-stage oscillator in accordance with the invention.
Figure 17:
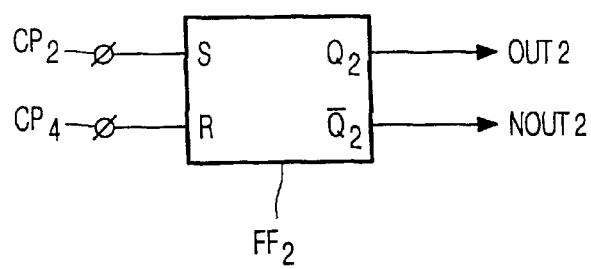

The four-stage oscillator further comprises two flip-flops shown in FIG. 17. The first flip-flop $FF_1$ has its set input S connected to the terminal $CP_1$ of the first stage and its reset input R to the terminal $CP_3$ of the third stage. The output $Q_1$ of the flip-flop $FF_1$ supplies a first squarewave output signal OUT1. The second flip-flop $FF_2$ has its set input S connected to the terminal $CP_2$ of the second stage and has its reset input R connected to the terminal $CP_4$ of the fourth stage. The output $Q_1$ of the flip-flop $FF_2$ supplies a second squarewave output signal $OUT_2$ which is 90 degrees phase-shifted with respect to the first output signal OUT1. This phase shift can be influenced by means of the voltage on the terminal $V_Q$ in the charging current supply of FIG. 16.

The starting means in the stages are required to impose the correct initial state, after which the oscillator can further operate autonomously. Starting is effected by briefly making the terminal STRT high with respect to the negative supply voltage terminal $V_{SS}$.

Figure 18:
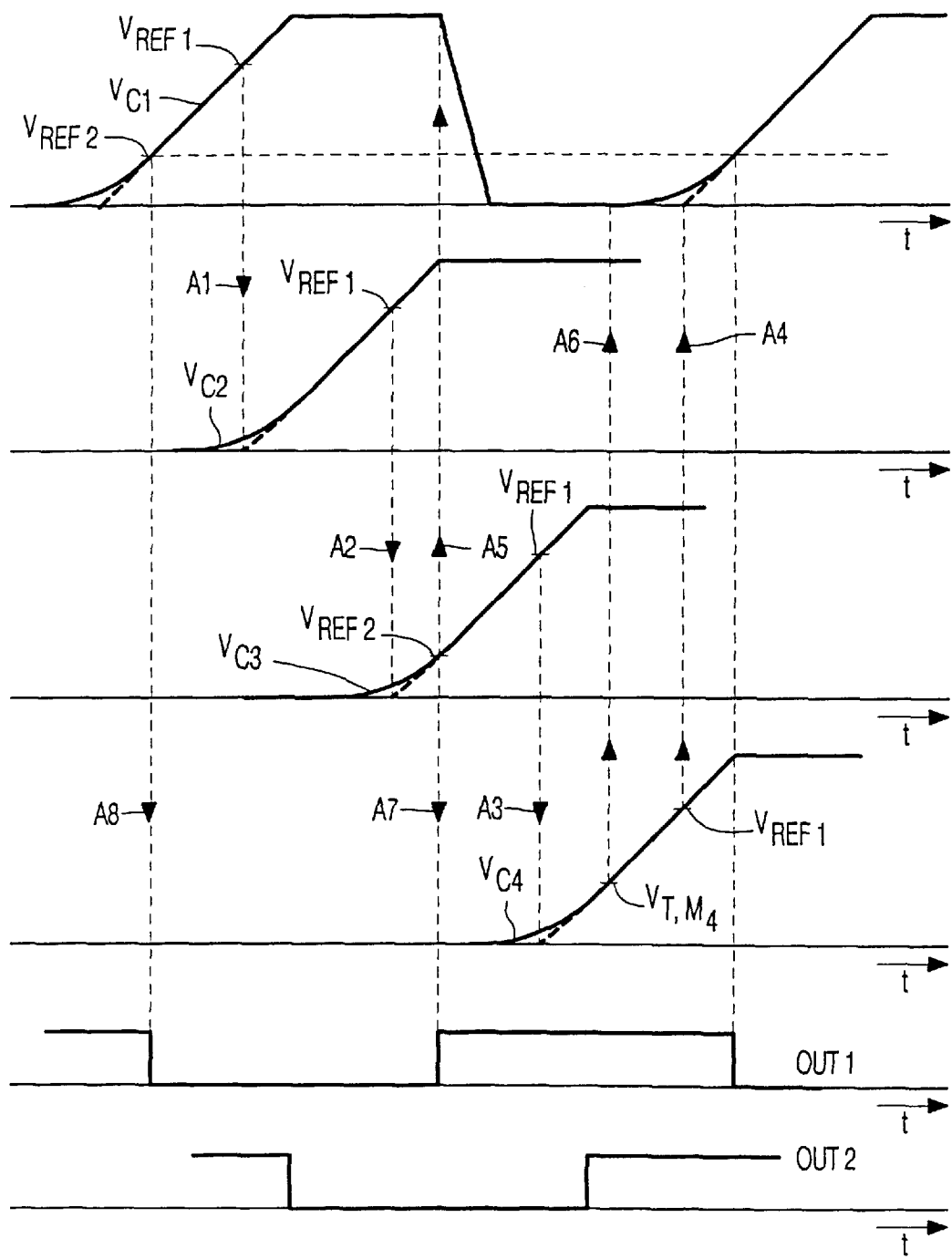
FIG. 18 is a diagram which represents signal waveforms which occur in a four-stage relaxation oscillator in accordance with the invention.

FIG. 18 illustrates the variation of the capacitor voltages $V_{C1}$, $V_{C2}$, $V_{C3}$ and $V_{C4}$ in the four stages. Charging of the capacitor $CAP_2$ is started gradually if the voltage $V_{C1}$ passes the threshold voltage $V_{REF1}$, which is indicated by means of an arrow A1. Charging of the capacitor $CAP_3$ is started gradually if the voltage $V_{C2}$ passes the threshold voltage $V_{REF1}$, which is indicated by means of an arrow A2. Charging of the capacitor $CAP_4$ is started gradually if the voltage $V_{C3}$ passes the threshold voltage $V_{REF1}$, which is indicated by means of an arrow A3. Charging of the capacitor $CAP_1$ is started gradually if the voltage $V_{C4}$ passes the threshold voltage $V_{REF1}$, which is indicated by means of an arrow A4. Discharging of the capacitor $CAP_1$ begins if the voltage $V_{C3}$ passes the threshold voltage $V_{REF2}$, which is indicated by means of an arrow A5. For this purpose, the comparator CMP of the first stage drives the transistor $M_3$ of the first stage into conduction, as a result of which the capacitor $CAP_1$ is discharged rapidly. As the voltage $V_{C3}$ on the terminal $C_3$ will remain higher than $V_{REF2}$ for a substantial time the comparator CMP of the first stage will still sustain conduction of the discharging transistor $M_3$ at the instant at which the gradual charging of the capacitor $CAP_1$ should begin again. In order to preclude this situation the transistor $M_4$ ensures that, under control of the voltage $V_{C4}$ from the fourth stage (at the instant indicated by an arrow A6), the drive to the discharging transistor $M_3$ is canceled. The transistor $M_4$ is turned on if the voltage $V_{C4}$ exceeds the internal threshold voltage $V_T$ of the MOS transistor $M_4$.

The output $Q_1$ of the flip-flop $FF_1$ and, consequently, the output signal OUT1 goes high when the voltage on the terminal $CP_1$ goes high, i.e. when the voltage $V_{C3}$ on the terminal $C_3$ exceeds the threshold voltage $V_{REF2}$. This instant is indicated by means of the arrow A7. The output $Q_1$ of the flip-flop $FF_1$ and, consequently, the output signal OUT1 goes low when the voltage on the terminal $CP_3$ goes high, i.e. when the voltage $V_{C1}$ on the terminal $C_1$ exceeds the threshold voltage $V_{REF2}$. This instant is indicated by means of the arrow A8. A similar analysis applies to the output signal OUT2, which explains that the signals OUT1 and OUT2 are 90 degrees out of phase when the terminal $V_Q$ carries the same voltage as the terminal $V_{REF1}$ (see FIG. 16). In that case all the charging currents are equal and the timing is identical for all stages. The phase difference can be influenced by slightly varying the voltage on the terminal $V_Q$ around the value of the voltage on the terminal $V_{REF1}$. However, this does not affect the oscillation frequency $F_{OSC}$.

It appears that only the rising edges in the voltages across the capacitors $CAP_i$(i=1.4) define the duration of the actual oscillation period $T_{OSC}$. Consequently, the discharging instant of a capacitor is non-critical and possible jitter at this instant does not play a part.

Figure 19:
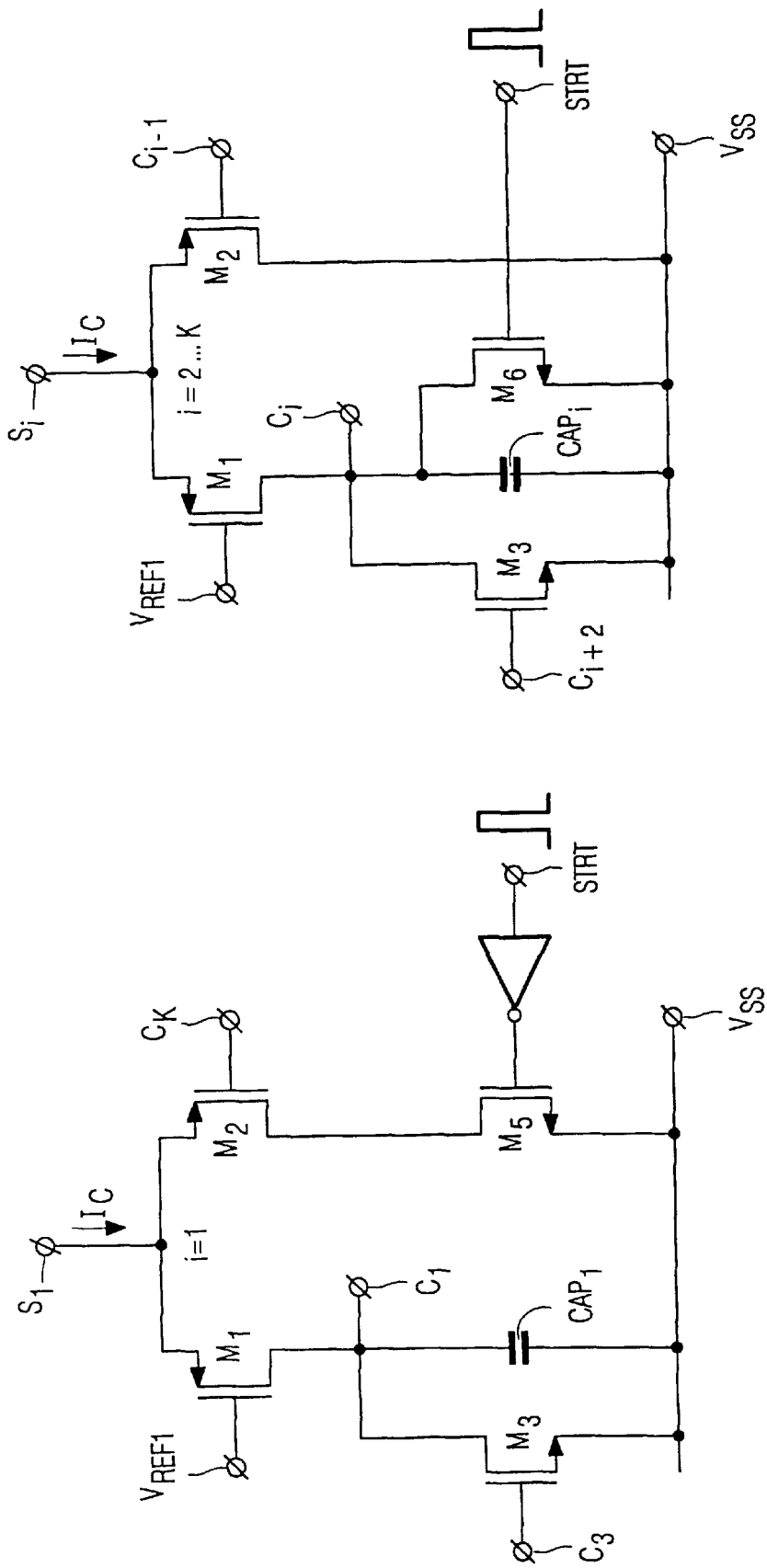
FIG. 19 is an electrical circuit diagram of stages for use in a six-or-more stage relaxation oscillator in accordance with the invention.

FIG. 19 shows the circuit diagram of a coupled sawtooth oscillator having six or more stages. The number of stages is represented by k (k>=6) and the number of the stage is represented by i (i=1 . . . k). The first stage (i=1) is largely identical to the first stage of the four-stage oscillator shown in FIG. 14. The difference is that the comparator CMP and the transistor $M_4$ are dispensed with and the discharging transistor $M_3$ has its gate connected directly to the terminal $C_3$. The other stages (i=2 . . . k) are largely identical to the stages shown in FIG. 15 and in this case the transistor $M_3$ has its gate connected directly to the terminal $C_{i+2}$. As a result of the larger number of stages the measure with the comparator CMP and the additional transistor $M_4$ is no longer necessary.

Figure 20:
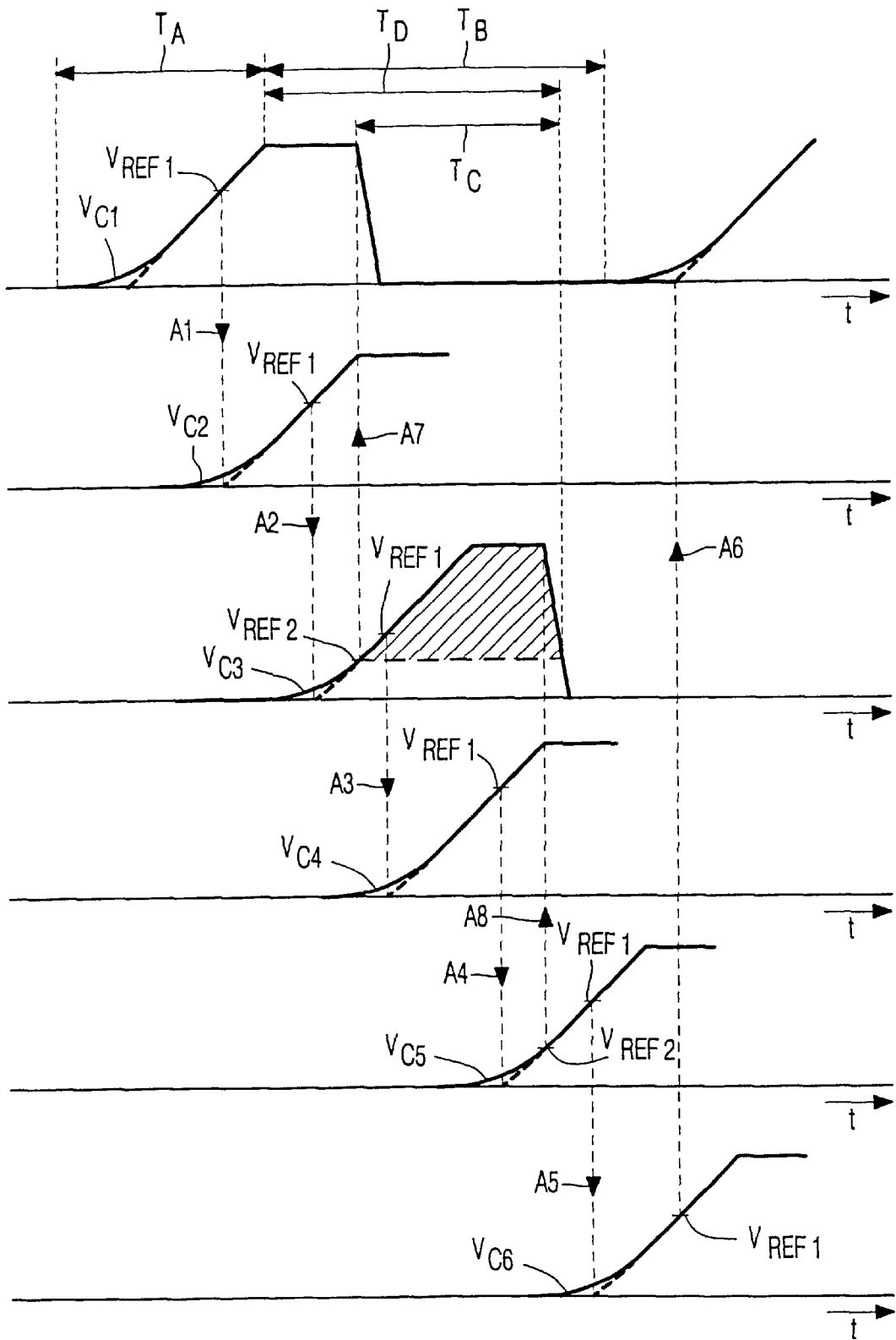
FIG. 20 is a diagram which represents signal waveforms which occur in a six-stage relaxation oscillator in accordance with the invention.

FIG. 20 shows the variation of the capacitor voltages $V_{C1}$, $V_{C2}$, $V_{C3}$, $V_{C4}$, $V_{C5}$ and $V_{C6}$ in a six-stage version (k=6). The gradual starting of the charging of the capacitor of a subsequent stage is initiated when the capacitor voltage of the preceding stage passes the threshold voltage $V_{REF1}$. These starting instants are indicated by means of the arrows A1 to A6. The capacitor $CAP_1$ of the first stage is discharged when the voltage $V_{C3}$ on the capacitor $CAP_3$ in the third stage exceeds the threshold value $V_{REF2}$. This instant is indicated by means of the arrow A7. In the present case this threshold value $V_{REF2}$ is equal to the internal threshold voltage of the NMOS transistor $M_3$ of the relevant stage. The capacitor $CAP_1$ in the first stage remains short-circuited by the transistor $M_3$ as long as the voltage $V_{C3}$ is higher than the threshold voltage $V_{REF2}$. This is represented by means of a shaded area in the diagram of the voltage $V_{C3}$. The capacitor $CAP_3$, in its turn, is discharged when the voltage $V_{C5}$ passes the threshold voltage $V_{REF2}$. This instant is indicated by means of an arrow A8. The charging current supply can be of a design similar to that shown in FIG. 16 but having two additional PMOS current source transistors.

It will be evident from the above examples that the capacitor which drives the transistor $M_2$ should not be discharged during the charging process of the capacitor to be charged, which is coupled to the transistor $M_2$. Consequently, the voltage on the driving capacitor should not be changed to such an extent that the differential pair prematurely interrupts the charging process of the capacitor to be charged. In the three-stage coupled sawtooth generator described hereinafter measures are taken to preclude this.

Figure 21:
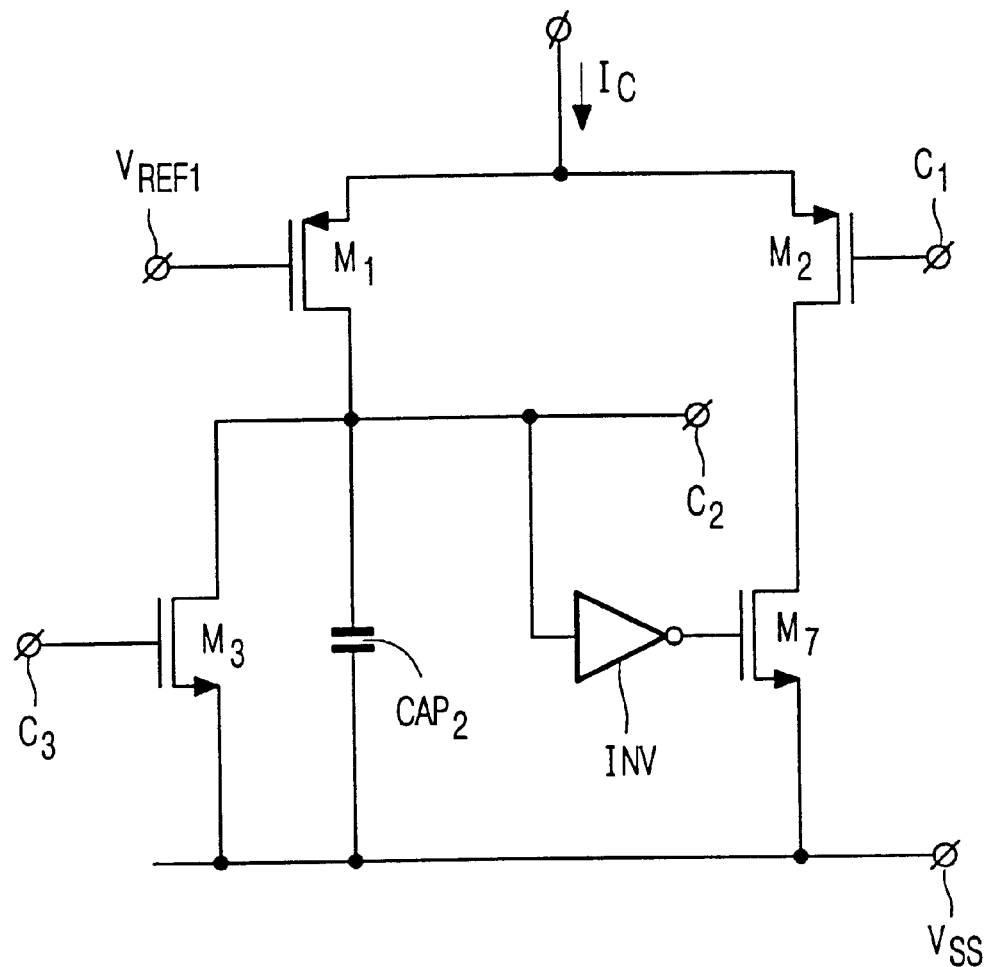
FIG. 21 is an electrical circuit diagram of the basic part of a stage for use in a three-stage relaxation oscillator in accordance with the invention.

FIG. 21 shows the second stage of a three-stage coupled sawtooth oscillator. The transistors $M_1$, $M_2$, $M_3$ and the capacitor $CAP_1$ are arranged in a manner corresponding to that shown in the first stage (i=1) of FIG. 19. However, the transistor $M_2$ has its drain coupled to the negative supply terminal $V_{SS}$ via an NMOS transistor $M_7$. This transistor $M_7$ has its gate connected to the terminal $C_2$ via an inverter INV. The transistors $M_1$, $M_2$, $M_3$ have their gates connected to the terminals $V_{REF1}$, $C_1$ and $C_3$, respectively. When during charging of the capacitor $CAP_2$ the voltage on the terminal $C_2$ reaches a given value, the output of the inverter goes low and the transistor $M_7$ is turned off. The whole charging current $I_C$ then keeps flowing through the transistor $M_1$ regardless of a possible premature decrease of the voltage on the terminal $C_1$.

Figure 22:
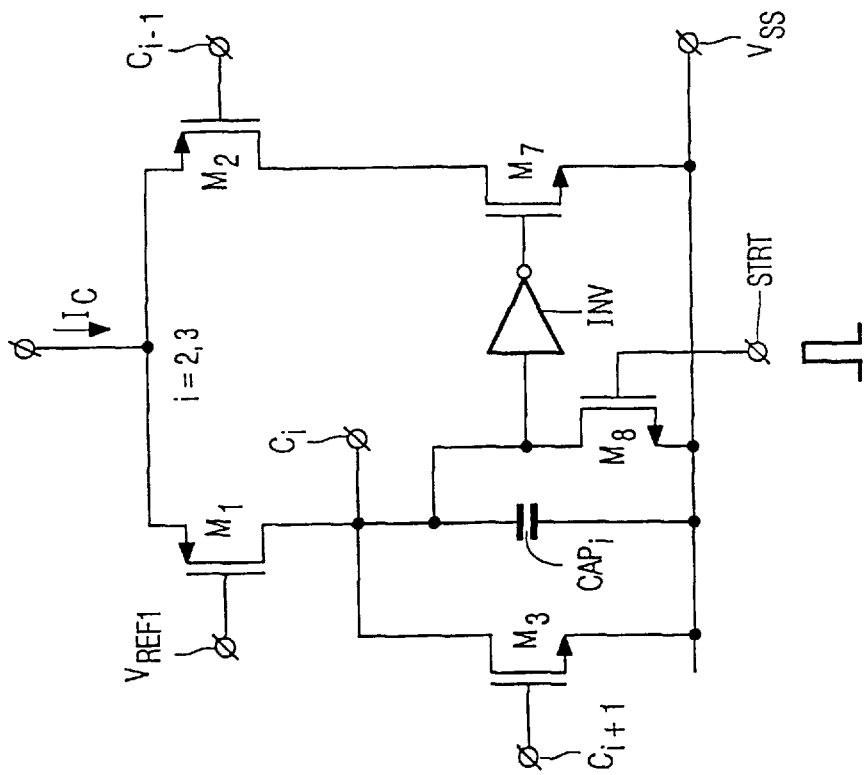
FIG. 22 is an electrical circuit diagram of stages for use in a three-stage relaxation oscillator in accordance with the invention.
Figure 22:
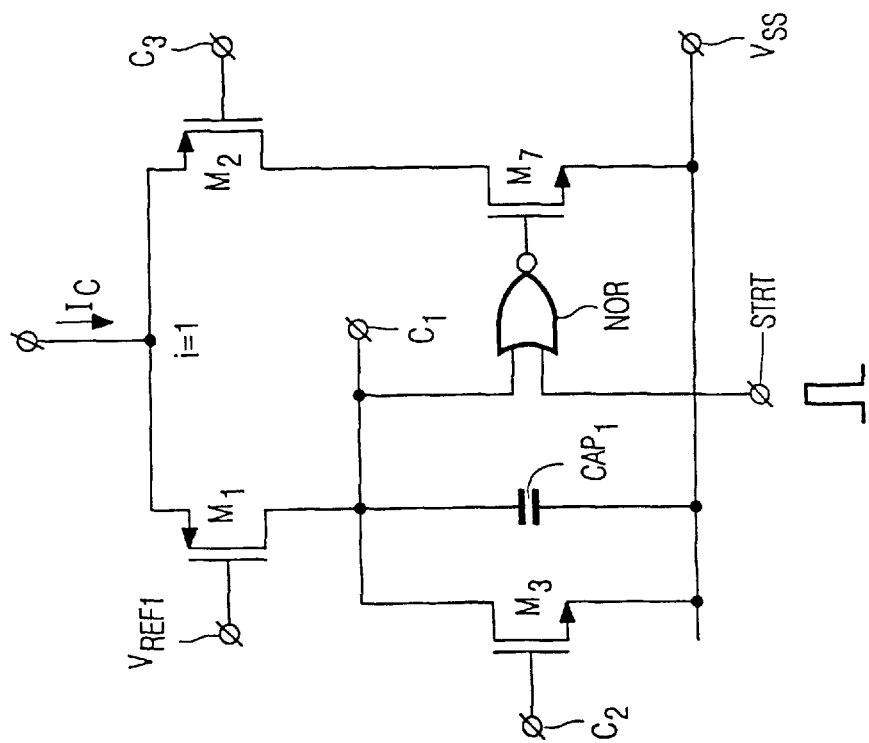

FIG. 22 shows the circuit diagram of a coupled sawtooth oscillator having 3 stages. The structure of the first stage (i=1) is similar to that of FIG. 21, except that the inverter INV has been replaced by a logic NOR-circuit NOR having two inputs, of which one input is connected to the terminal $C_1$ and of which the other input is connected to the terminal STRT to receive a starting signal similar to that in the preceding embodiments. In the first stage the transistor $M_2$ has its gate connected to the terminal $C_3$ and the transistor $M_3$ has its gate connected to the terminal $C_2$. The structure of the second and the third stage (i=2, 3) is similar to that of FIG. 21 but an NMOS starting transistor $M_8$ has been added, which transistor is arranged in parallel with the capacitor $CAP_i$ and has its gate connected to the terminal STRT. In the second stage the gates of the transistors $M_2$ and $M_3$ are connected to the terminals $C_1$ and $C_3$, respectively, and in the third stage these gates are connected to $C_2$ and $C_1$.

Figure 23:
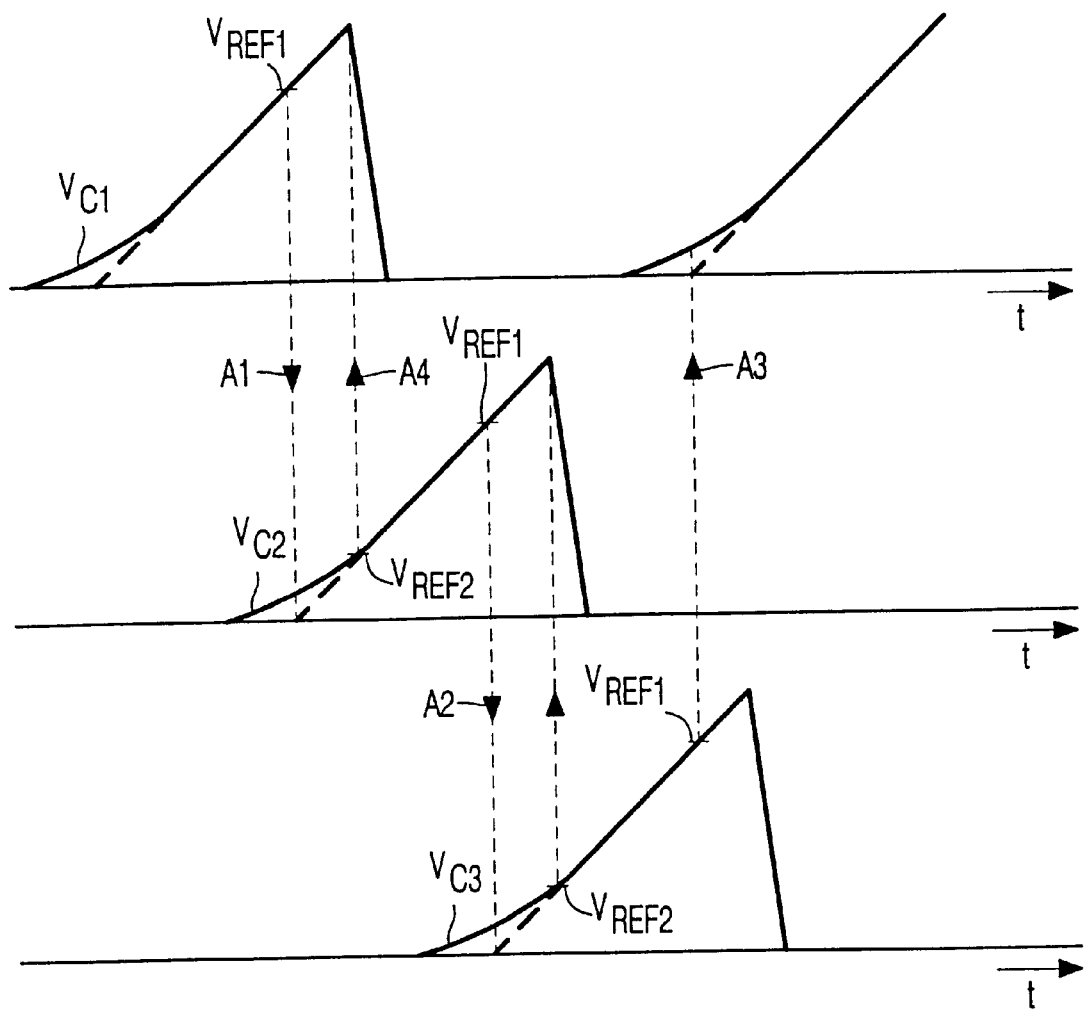
FIG. 23 is a diagram which represents waveforms which occur in a three-stage relaxation oscillator in accordance with the invention.

FIG. 23 shows the variation of the capacitor voltages $V_{C1}$, $V_{C2}$, and $V_{C3}$. The gradual starting of the charging process of the capacitor of a subsequent stage is initiated when the capacitor voltage of the preceding stage passes the threshold voltage $V_{REF1}$. These starting instants are indicated by means of the arrows A1, A2 and A3. The capacitor $CAP_1$ of the first stage is discharged when the voltage $V_{C2}$ on the capacitor $CAP_2$ in the second stage exceeds the threshold value $V_{REF2}$. In the present case, this threshold value $V_{REF2}$ is equal to the internal threshold voltage of the NMOS transistor $M_3$ of the relevant stage. This instant is indicated by the arrow A4. The capacitor $CAP_1$ remains short-circuited as long as the voltage $V_{C2}$ is higher than the threshold voltage $V_{REF2}$.

A stage need to be provided with current only during time periods in which the capacitor of that stage is being charged. Taking the first stage of the six-stage coupled sawtooth oscillator shown in FIGS. 19 and 20 as an example, it appears that this stage only needs current during the time period $T_A$ in which the capacitor $CAP_1$ is charged. In other words, this stage only needs current during the rising edge of the sawtooth voltage $V_{C1}$. In the remainder of the time, i.e. during the time period TB, the capacitor has to be discharged within a time period indicated by $T_C$. In embodiments with 4 or more stages the charge of the capacitors has to be maintained for a while before the capacitor is discharged. In FIG. 20 the horizontal portions of the capacitor voltages indicate when the charge is maintained.

During the time periods $T_B$ no charge current is needed, and in fact this current is dumped to the negative supply voltage terminal $V_{SS}$ by means of the transistor $M_2$ of the differential pair. From the point of view of power consumption it is advantageous to use this current for another purpose or to switch off this current entirely.

In the former case, during the time period $T_B$, the charge current of a stage can be routed to another stage by means of switches in order to use this current as a charging current for the other stage. This routed current should be available in that other stage before the differential pair of the other stage decides to start the charging of its capacitor. A further advantage of this current routing system is that the total current consumption remains constant.

In the latter case the charging current $I_C$ at terminal $S_i$ is switched off during the time period $T_B$, preferably by short-circuiting the gate-source junctions of transistors in the current supply. As a result of the filtering of the noise at the level $V_H$, the 1/f noise present in the charging current $I_C$ now becomes the dominant contributor to the phase noise in the coupled sawtooth generator. It appears that this switched-bias technique considerably reduces the low frequency phase noise of the coupled sawtooth generator.

Figure 24:
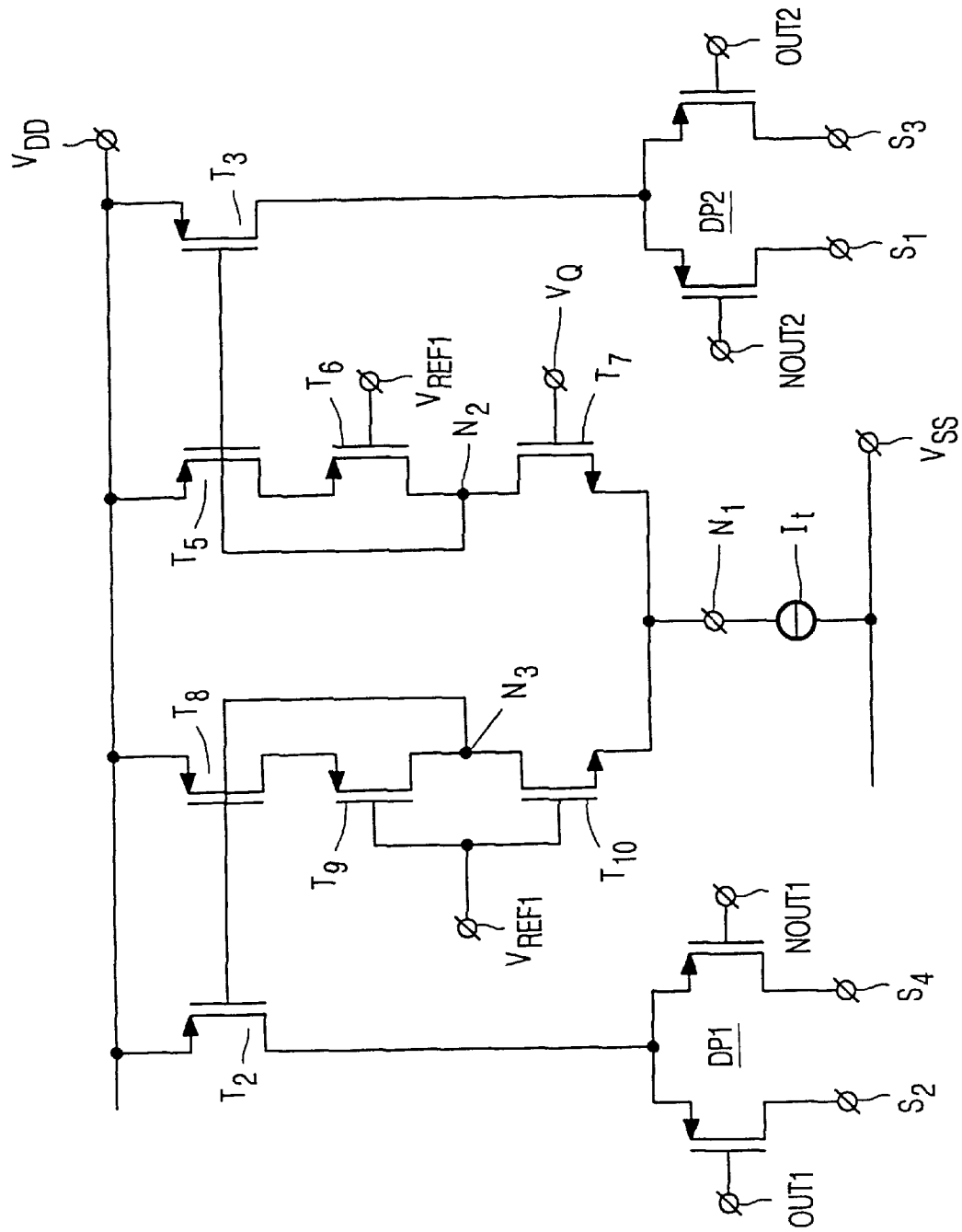
FIG. 24 is an electrical circuit diagram of a charging current supply with current routing for a four-stage relaxation oscillator in accordance with the invention.

FIG. 24 shows an implementation of the current routing in a four-stage coupled sawtooth generator. The charging current supply circuit is similar to that of FIG. 16. However, the transistors $T_1$ and $T_4$ are dispensed with, the terminals $S_2$ and $S_4$ are coupled to the transistor $T_2$ through respective PMOS transistors of a differential pair DP1, and the terminals $S_1$ and $S_3$ are coupled to the transistor $T_3$ through respective PMOS transistors of a differential pair DP2. Differential pair DP1 is driven by the complementary output signals OUT1 and NOUT1 of the first flip-flop FF1 (FIG. 17) and differential pair DP2 is driven by the complementary output signals OUT2 and NOUT2 of the second flip-flop FF2. The current from the transistor $T_2$ is now alternately used as a charging current for stage 2 and stage 4, and the current from the transistor $T_3$ is alternately used for stages 1 and 3. A similar appraoch can be applied to a six-stage coupled sawtooth oscillator.

Figure 25:
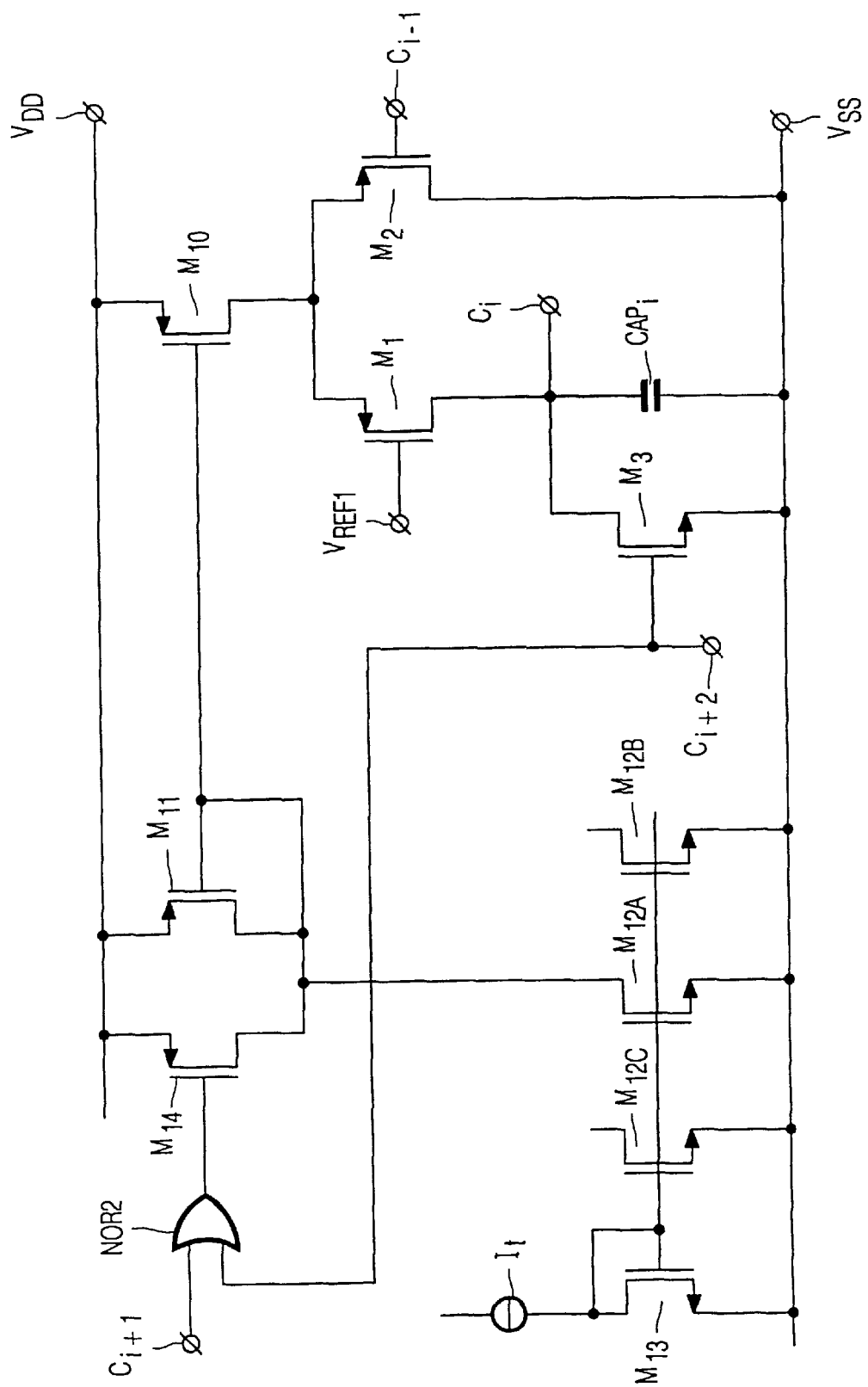
FIG. 25 is an electrical circuit diagram of a stage with switched-bias technique for use in a relaxation oscillator in accordance with the invention.

FIG. 25 shows an implementation of the switched-bias technique in a stage which can be used, for example, in a six-stage coupled sawtooth generator. Only stage 1 is shown. The other stages are the same. The differential pair $M_1$–$M_2$ receives charging current from a PMOS current source transistor $M_{10}$ which forms a current mirror with a diode-connected PMOS transistor $M_{11}$. The transistor $M_{11}$ in turn receives current from a NMOS transistor $M_{12A}$ which forms a current mirror with a diode-connected NMOS transistor $M_{13}$. The transistor $M_{13}$ receives the bias current source $I_t$ which may be tuneable to control the oscillation frequency of the coupled sawtooth generator. A PMOS transistor $M_{14}$ parallel to the transistor $M_{11}$ has its gate connected to the output of a logic NOR-circuit NOR2 having two inputs, of which one input is connected to the terminal $C_{i+2}$ and of which the other input is connected to the terminal $C_{i+1}$. However, the logic NOR-circuit NOR2 may be replaced by a logic inverter which has its input connected to the terminal $C_{i+2}$. Further NMOS transistors $M_{12B}$, $M_{12C}$, etc., identically arranged as the transistor $M_{12A}$ provide bias current to the other stages.

In this manner each stage has its own bias current supply path, switchable by means of the transistor $M_{14}$. In the implementation with the logic inverter the PMOS current mirror $M_{10}$–$M_{11}$ is switched off by means of transistor $M_{14}$ during the time period $T_C$ (FIG. 20) in which the capacitor $CAP_i$ is discharged. In this way no change will be noticeable in the waveforms of the capacitor voltages and also the timing is not harmed. The timing signals for driving the bias-switching transistor $M_{14}$ of the stages are generated by the oscillator itself and need not to be generated with additional circuitry.

In the implementation with the logic-NOR circuit NOR2 the time period for switching off the PMOS current mirror $M_{10}$–$M_{11}$ is extended to $T_D$ (FIG. 20), as a result of which the current consumption is reduced even more. The bias current is switched off if the voltage on terminals $C_{i+1}$ and/or $C_{i+2}$ is greater than the reference voltage $V_{REF2}$.

The embodiments described by way of example employ unipolar (MOS) transistors. However, instead of these it is also possible to use bipolar transistors, the first main electrode, the second main electrode and the control electrode correspond to the emitter, the collector and the base of the bipolar transistor.

What is claimed is:

1. A relaxation oscillator comprising stages each having a capacitor $(CAP_i)$ and means for charging $(M_1, M_2, I_C)$ the capacitor $(CAP_i)$ as soon as a voltage of the capacitor of another stage passes a first threshold voltage $(V_{REF1})$, characterized in that the means for charging are adapted to gradually cause the charging of the capacitor to be started.

2. A relaxation oscillator as claimed in claim 1, characterized in that the means for charging include a comparator $(M_1, M_2)$ for comparing the voltage of said capacitor of said other stage with the first threshold voltage, and a charging current source $(I_C)$ coupled to the capacitor $(CAP_i)$ to supply a charging current to the capacitor, which charging current gradually increases to a final value in response to the comparison.

3. A relaxation oscillator as claimed in claim 2, characterized in that the comparator comprises a differential pair comprising a first transistor $(M_1)$ and a second transistor $(M_2)$, each having a first main electrode, a second main electrode and a control electrode, the first main electrode of the first transistor $(M_1)$ and the first main electrode of the second transistor $(M_2)$ being coupled to the charging current source $(I_C)$, the second main electrode of the first transistor $(M_1)$ being coupled to the capacitor $(CAP_i)$, the control electrode of the first transistor $(M_1)$ being connected to receive the first threshold voltage $(V_{REF1})$, and the control electrode of the second transistor $(M_2)$ being connected to receive the voltage of said capacitor of said other stage.

4. A relaxation oscillator as claimed in claim 3, characterized in that the stage includes a third transistor $(M_3)$ having a main current path arranged in parallel with the capacitor $(CAP_i)$ to discharge the capacitor as soon as a voltage of the capacitor of another stage passes a second threshold voltage.

5. A relaxation oscillator as claimed in claim 4, characterized in that the stage includes a further comparator (CMP) having inputs connected to receive the second threshold voltage $(V_{REF2})$ and the voltage of the capacitor of the other stage, and having an output connected to drive a control electrode of the third transistor $(M_3)$.

6. A relaxation oscillator as claimed in claim 5, characterized in that the stage includes means $(M_4)$ for inhibiting the drive to the control electrode of the third transistor $(M_3)$ in response to a voltage across the capacitor of a still other stage.

7. A relaxation oscillator as claimed in claim 6, characterized in that the means for inhibiting include a fourth transistor $(M_4)$ having a main current path connected between the control electrode of the third transistor $(M_3)$ and a reference terminal $(V_{SS})$, and having a control electrode connected to receive the voltage across the capacitor of the still other stage.

8. A relaxation oscillator as claimed in claim 3, characterized in that one of the stages includes means $(M_5)$ for interrupting a current from the second main electrode of the second transistor $(M_2)$ of the differential pair in response to a starting signal, and in that the other stages include means $(M_6)$ for discharging the respective capacitor $(CAP_i)$ of these other stages in response to the starting signal.

9. A relaxation oscillator as claimed in claim 4, characterized in that in each of the stages the second transistor $(M_2)$ of the differential pair has its second main electrode coupled to a supply terminal $(V_{SS})$ via the main current path of a further transistor $(M_7)$, which further transistor $(M_7)$ has a control electrode connected to the capacitor $(CAP_i)$ of the relevant stage via an inverter (INV).

10. A relaxation oscillator as claimed in claim 9, characterized in that one of the stages includes means (NOR) for turning off the further transistor $(M_7)$ in response to a starting signal, and in that the further stages include means $(M_8)$ for discharging the respective capacitors $(CAP_i)$ of said further stages and for turning on the respective further transistor of said further stages in response to the starting signal.

11. A relaxation oscillator as claimed in claim 1, further comprising means (DP1, DP2, $FF_1$, $FF_2$) for routing a charging current of the capacitor of one stage to another stage during time periods $(T_B)$ that no charging current is needed in the one stage.

12. A relaxation oscillator as claimed in claim 1, further comprising means $(I_I, M_{13}, M_{12A}, M_{11}, M_{10})$ for providing bias current to a stage, and means $(M_{14}, NOR2)$ for switching off the bias bias current during at least part of the time period $(T_B)$ that no charging current is needed in the stage.

* * * * *